(12) United States Patent
Pedrosa et al.

(10) Patent No.: US 10,408,904 B2
(45) Date of Patent: Sep. 10, 2019

(54) MRI USING A MODIFIED DIXON SEQUENCE WITH REDUCTION OF FOLD-OVER ARTIFACTS

(71) Applicants: KONINKLIJKE PHILIPS N.V., Eindhoven (NL); BOARD OF REGENTS OF THE UNIVERSITY OF TEXAS SYSTEM, Austin, TX (US)

(72) Inventors: Ivan Pedrosa, Eindhoven (NL); Ananth Madhuranthakam, Eindhoven (NL); Ivan Dimitrov, Eindhoven (NL)

(73) Assignees: Koninklijke Philips N.V., Eindhoven (NL); Board of Regents of the University of Texas System, Austin, TX (US)

(*) Notice: Subject to any disclaimer, the term of this patent is extended or adjusted under 35 U.S.C. 154(b) by 517 days.

(21) Appl. No.: 15/022,008

(22) PCT Filed: Sep. 2, 2014

(86) PCT No.: PCT/IB2014/064186
§ 371 (c)(1),
(2) Date: Mar. 15, 2016

(87) PCT Pub. No.: WO2015/036895
PCT Pub. Date: Mar. 19, 2015

(65) Prior Publication Data
US 2016/0231406 A1 Aug. 11, 2016

Related U.S. Application Data

(60) Provisional application No. 61/878,289, filed on Sep. 16, 2013.

(51) Int. Cl.
*G01R 33/48* (2006.01)
*G01R 33/483* (2006.01)
(Continued)

(52) U.S. Cl.
CPC ....... *G01R 33/4833* (2013.01); *G01R 33/307* (2013.01); *G01R 33/32* (2013.01);
(Continued)

(58) Field of Classification Search
CPC . G01R 33/4828–33/485; G01R 33/307; G01R 33/5615; G01R 33/32
(Continued)

(56) References Cited

U.S. PATENT DOCUMENTS

| 5,003,264 | A | 3/1991 | Koizumi et al. |
| 5,522,390 | A | 6/1996 | Tuithof et al. |

(Continued)

FOREIGN PATENT DOCUMENTS

EP 0950902 A2 10/1999

OTHER PUBLICATIONS

Ma "Breath-Hold Water and Fat Imaging Using a Dual-Echo . . . " Magnetic Resonance in Med. vol. 52, p. 415-519 (2004).
(Continued)

*Primary Examiner* — Patrick Assouad
*Assistant Examiner* — Demetrius R Pretlow

(57) ABSTRACT

A magnetic resonance imaging (MRI) system (500), the system includes at least one controller (510) which performs a modified rotated slab excitation (mROSE) sequence for volume selection to exclude portions of a subject under exam which are within the scanning volume and outside of a field-of-view (FOV) so as to reduce foldover artifacts which originate from the excluded portions of the subject under exam, where the mROSE sequence performs volume excitation based upon either optimized symmetrical, minimum-phase, or stretched minimum-phase radio-frequency (RF) pulses in a sagittal plane and encodes the scanning volume in a coronal plane. The controller also performs a chemical-shift sequence including a modified DIXON
(Continued)

(mDIXON) sequence for substantially uniform fat/water separation within a FOV which lies within the scanning volume; and/or acquires echo information for reconstructing at least a part of an image.

19 Claims, 4 Drawing Sheets

(51) Int. Cl.
  *G01R 33/30* (2006.01)
  *G01R 33/32* (2006.01)
  *G01R 33/485* (2006.01)
  *G01R 33/561* (2006.01)

(52) U.S. Cl.
  CPC ....... *G01R 33/485* (2013.01); *G01R 33/4828* (2013.01); *G01R 33/5615* (2013.01)

(58) Field of Classification Search
  USPC ........................................................ 324/309
  See application file for complete search history.

(56) References Cited

U.S. PATENT DOCUMENTS

| | | | |
|---|---|---|---|
| 9,881,394 B2* | 1/2018 | Ma | G06T 11/008 |
| 2004/0010191 A1* | 1/2004 | Yatsui | A61B 5/4872 |
| | | | 600/410 |
| 2006/0250132 A1 | 11/2006 | Reeder et al. | |
| 2010/0111390 A1* | 5/2010 | Fenchel | G06K 9/6292 |
| | | | 382/131 |
| 2012/0176131 A1* | 7/2012 | Madhuranthakam | |
| | | | G01R 33/4828 |
| | | | 324/307 |
| 2012/0301000 A1 | 11/2012 | Bornert | |
| 2013/0002247 A1* | 1/2013 | Haacke | G01R 33/56545 |
| | | | 324/307 |
| 2013/0214783 A1* | 8/2013 | Zhao | G01R 33/4828 |
| | | | 324/309 |
| 2014/0210471 A1* | 7/2014 | Stemmer | G01R 33/56554 |
| | | | 324/309 |
| 2014/0285195 A1* | 9/2014 | Stemmer | G01R 33/4818 |
| | | | 324/309 |
| 2015/0025362 A1* | 1/2015 | Biber | G01R 33/3415 |
| | | | 600/422 |

OTHER PUBLICATIONS

Brau "Rotated Slab Excitation (ROSE) for Reduced Foldover Artifacts in Coronal . . . " Proc. Intl. Socl. Mag. Reson. Med. 16 p. 502 (2008).

Yuan et al "Towards Fast and Accurate Temperature Mapping With Proton Resonance . . . " Quant. Imaging Med Surg. (2012) vol. 22. p. 21-32.

Zhao et al "Reduced Field-Of View With Two-Dimensional Spatially-Selective RF . . . " Magnetic Resonance in Med. vol. 53, p. 1118-1125 (2005).

* cited by examiner

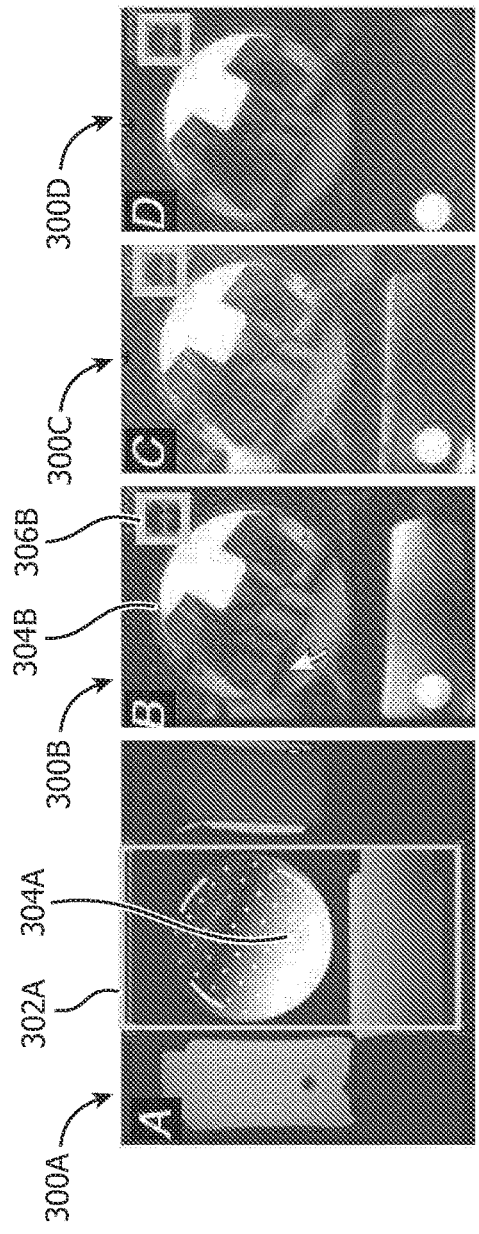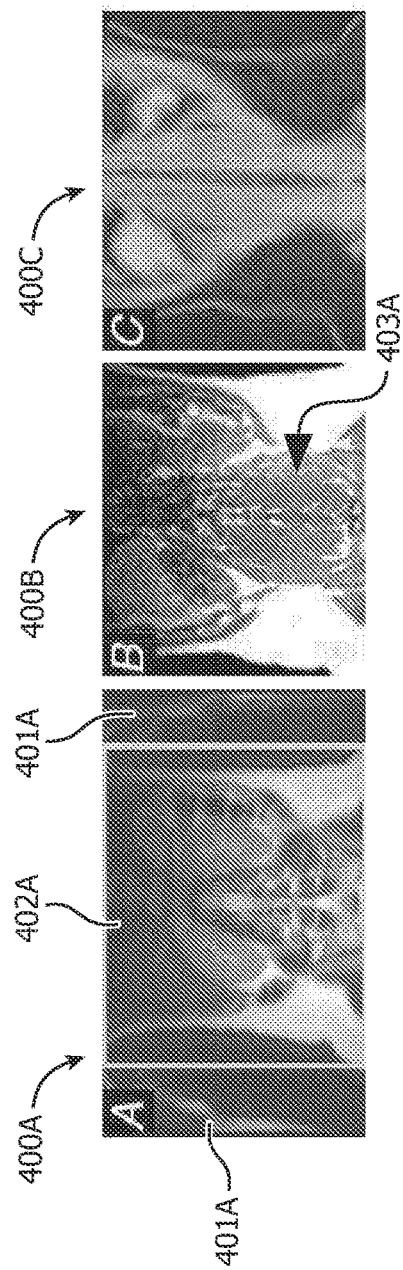

MRI USING A MODIFIED DIXON SEQUENCE WITH REDUCTION OF FOLD-OVER ARTIFACTS

CROSS REFERENCE TO RELATED APPLICATIONS

This application is a U.S. national phase application of International Application No. PCT/IB2014/064186, filed on Sep. 2, 2014, which claims the benefit of U.S. provisional Application Ser. No. 61/878,289 filed on Sep. 16, 2013 and is incorporated herein by reference.

The present system relates to a magnetic resonance imaging (MRI) system for acquiring dynamic contrast enhanced (DCE) images of an abdomen or pelvis of a patient, for example, with acquisition times within a breathhold and, more particularly, to a magnetic resonance imaging (MRI) system for performing a DCE image acquisition while achieving homogeneous fat suppression and out-of field-of-view (FOV) signal suppression within a breath-hold scan time.

Magnetic Resonance Imaging (MRI) to acquire images of an abdomen and/or pelvis of a patient presents many challenges such as those due to a requirement of high spatial resolution combined with a constraint of a short acquisition time which is within a breath-hold of the patient (e.g., about 15-25 seconds). For a given spatial resolution, a scan time is directly proportional to a size of the field of view (FOV) and, hence, a reduced FOV can increase the spatial resolution within a reasonable breath-hold scan time.

To acquire images of the abdomen and/or pelvis, patients are often placed in magnetic resonance (MR) scanners with their arms above their head to minimize wrap around artifacts along the right-left (RL) direction with a reduced FOV. In certain clinical cases, such as in MR Enterography (MRE), patients may be debilitated and imaging portions of the abdomen and/or pelvis (i.e. torso) of the patient with the patient's arms above their head is not always possible due to various reasons, such as patient's inability to keep arms above their head, and use of medical devices (e.g., monitoring devices, lines, sensors, tubes, etc.) which may be attached to the patient. In such instances, imaging with the arms positioned down along each the side of the patient may be necessary and a large FOV is typically used to avoid wrap around artifacts, which result in longer acquisition times. Parallel imaging methods can be used to accelerate the acquisition and reduce the total scan times.

However, in a typical scan when a patient's arms are positioned besides the patient, a large FOV combined with high acceleration factors usually results in acquired images having undesirable artifacts. These artifacts are due to signals originating outside of the FOV, particularly, signals due to the arms of the patient which are outside of the FOV. Accordingly, a Rotated Slab Excitation (ROSE) approach, in which a 3D volume is encoded in the coronal plane while volume excitation is switched from an anterior-posterior (AP) direction to an RL direction (e.g., a sagittal excitation), can be used to suppress signals which originate outside of the FOV. However, high-resolution ROSE approach with good out-of-FOV signal suppression often leads to increased minimum echo times (TEs) due to the use of prolonged radiofrequency (RF) pulses. Unfortunately, when this ROSE approach is combined with chemical-shift approach for fat separation, which is often a confounding tissue and needs to be suppressed for improved delineation of the underlying structures, a fat/water separation process fails due to a violation of optimum echo times (1E) which are increased due to the increase in the minimum echo times (TEs) required by the ROSE approach. For example, a typical ROSE approach requires a TE of 1.5 ms for resolution of 1×1 mm, which exceeds the optimal TE of 1.2 ms required by the fat/water separation algorithm at 3 Tesla field strength.

The system(s), device(s), method(s), user interface(s), computer program(s), processes, etc. (hereinafter each of which will be referred to as system, unless the context indicates otherwise), described herein address problems in prior art systems.

In accordance with embodiments of the present system, there is disclosed a magnetic resonance imaging (MRI) system, the system includes at least one controller which: performs a chemical-shift sequence including a modified DIXON (mDIXON) sequence for substantially uniform fat/water separation within a field-of-view (FOV) which lies within a scanning volume, the chemical shift sequence may be performed in the coronal direction; performs a modified rotated slab excitation (mROSE) sequence for volume selection to exclude portions of a subject under exam (e.g., a human, an animal, a phantom, etc., each of which for the sake of clarity will be commonly referred to as a patient or subject unless the context indicates otherwise) which are within the scanning volume and outside of the FOV so as to reduce, prevent, and/or suppress (hereinafter each of which may be commonly referred to as suppress, unless the context indicates otherwise) foldover artifacts which originate from the excluded portions of the patient, wherein the mROSE sequence encodes the scanning volume in a coronal plane and performs volume excitation based upon either optimized symmetric, minimum-phase, or stretched minimum-phase radio-frequency (RF) pulses in a sagittal plane; and/or acquires echo information for reconstructing at least a part of an image. The excluded portions of the patient may include the patients, arms, hands, fingers, etc., each of which will be commonly referred to as arms for the sake of clarity unless the context indicates otherwise. The method may provide for parts of the skin, subcutaneous fat, and selected lateral parts of the internal organs to be excluded, without introducing fold-over artifacts.

In accordance with yet further embodiments of the present system, the at least one controller may acquire the echo information while arms of the patient are within the scanning volume and positioned at the sides of the torso of the patient. The MRI system may further include a support movably controlled by the at least one controller and which is configured to position the patient to scanning position relative to the scanning volume. Further, it is envisioned that the mDIXON and mROSE sequences and the image acquisition may be performed substantially within a twenty second time interval with significantly high spatial resolution. Moreover, the RF pulses may be configured to reduce excitation of the excluded portions of the patient. Further, it is also envisioned that the controller may acquire the echo information within an optimum echo time (1E) for substantially uniform fat/water separation.

In accordance with yet other embodiments of the present system, there is disclosed a method of reconstructing images obtained by an MR imaging (MRI) system, the method performed by at least one controller of the MR imaging system and may include one or more acts of: performing a chemical-shift sequence including a modified DIXON (mDIXON) sequence for substantially uniform fat/water separation within a field-of-view (FOV) which lies within a scanning volume; performing a modified rotated slab excitation (mROSE) sequence for volume selection to exclude portions of a patient which are outside of the FOV so as to reduce foldover artifacts which originate from the excluded portions of the patient, wherein the mROSE sequence encodes the scanning volume in a coronal plane and performs volume excitation based upon either optimized symmetric, minimum-phase, or stretched minimum-phase radio-frequency (RF) pulses in a sagittal plane; and acquiring echo information for reconstructing at least a part of an image.

It is also envisioned that the echo information may be acquired while arms of the patient are within the scanning volume and positioned at the sides of the torso of the patient. Further, the method may include an act of controlling, by at least one controller, a support to position the patient to scanning position within the scanning volume. The acts of performing the mDIXON and mROSE sequences and the image acquisition may be performed substantially within a 15-to-25 second time interval. However, in accordance with yet other embodiments of the present system, other time intervals are also envisioned. The method may further include an act of reducing the excitation of the excluded portions of the patient using the RF pulses. It is also envisioned that the controller may acquire the echo information within an optimum echo time (TE) for substantially uniform fat/water separation.

In accordance with other embodiments of the present system, there is disclosed a computer program stored on a non-transitory computer readable memory medium, the computer program configured to reconstruct images obtained from a magnetic resonance (MR) image system, the computer program including a program portion configured to: perform a chemical-shift sequence including a modified DIXON (mDIXON) sequence for substantially uniform fat/water separation within a field-of-view (FOV) which lies within a scanning volume; perform a modified rotated slab excitation (mROSE) sequence for volume selection to exclude portions of a patient which are within the scanning volume and outside of the FOV so as to reduce foldover artifacts which originate from the excluded portions of the patient, wherein the mROSE sequence encodes the scanning volume in a coronal plane and perform volume excitation based upon either optimized symmetric, minimum-phase, or stretched minimum-phase radio-frequency (RF) pulses in a sagittal plane; and acquire echo information for reconstructing at least a part of an image.

It is also envisioned that the program portion may be further configured to acquire the echo information while arms of the patient are within the scanning volume and positioned at the sides of the torso of the patient. The program portion may be further configured to control a support to position the patient into a scanning position within the scanning volume. In accordance with yet other embodiments of the present system the program portion may be further configured to perform the mDIXON and mROSE sequences and the image acquisition substantially within 15-to-25 second time interval. The program portion may be further configured to reduce the excitation of the excluded portions of the patient using the RF pulses. Further, the program portion may be further configured to acquire the echo information within an optimum echo time (TE) for substantially uniform fat/water separation.

The invention is explained in further detail, and by way of example, with reference to the accompanying drawings wherein:

FIG. 3A shows an image acquired using a phantom and application of a small FOV;

FIG. 3B shows an image of a portion of the phantom acquired using symmetric long RF pulses which result in an excellent out-of-volume signal suppression but poor mDIXON fat/water separation;

FIG. 3C shows an image of a portion of the phantom acquired using shorter symmetric pulses which improve mDIXON reconstruction but cause poor out-of field-of-view (FOV) suppression with a standard ROSE method;

FIG. 3D shows an image of a portion of the phantom acquired in accordance with embodiments of the present system;

FIG. 4A shows an image of a patient acquired using a small coronal FOV;

FIG. 4B shows an image of the patient acquired using a small FOV;

FIG. 4C shows an image of the patient acquired in accordance with embodiments of the present system.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well known devices, circuits, tools, techniques and methods are omitted so as not to obscure the description of the present system. It should be expressly understood that the drawings are included for illustrative purposes and do not represent the entire scope of the present system. In the accompanying drawings, like reference numbers in different drawings may designate similar elements.

In accordance with embodiments of the present system, an MRI system is disclosed which uses minimum-phase RF pulses that provide enhanced out-of FOV suppression without increasing echo times (TEs) so that the echo times (TEs) are substantially optimal and do not exceed upper threshold values of approximately 2.2 ms for the first and 4.4 ms for the second echo, at 1.5T; and 1.2 for the first and 2.4 ms for the second echo at 3T. This minimum-phase RF pulse approach combined with a chemical-shift technique allows for the acquisition of data at optimum echo times (TEs) which may be configured to provide uniform fat/water separation. In accordance with embodiments of the present system, the minimum-phase RF pulses may provide excellent out of FOV suppression and enable the use of very high acceleration factors in the RL direction to reduce scan times. The combination of all the above-described approaches provides for an MR imaging technique for acquiring MR images with high spatial resolution within breath hold acquisition times and uniform fat/water separation. Further, these images can be acquired while the patient's arms are positioned at their side (e.g., on the respective sides of the patient's torso) for enhanced patient comfort.

Figure 1:
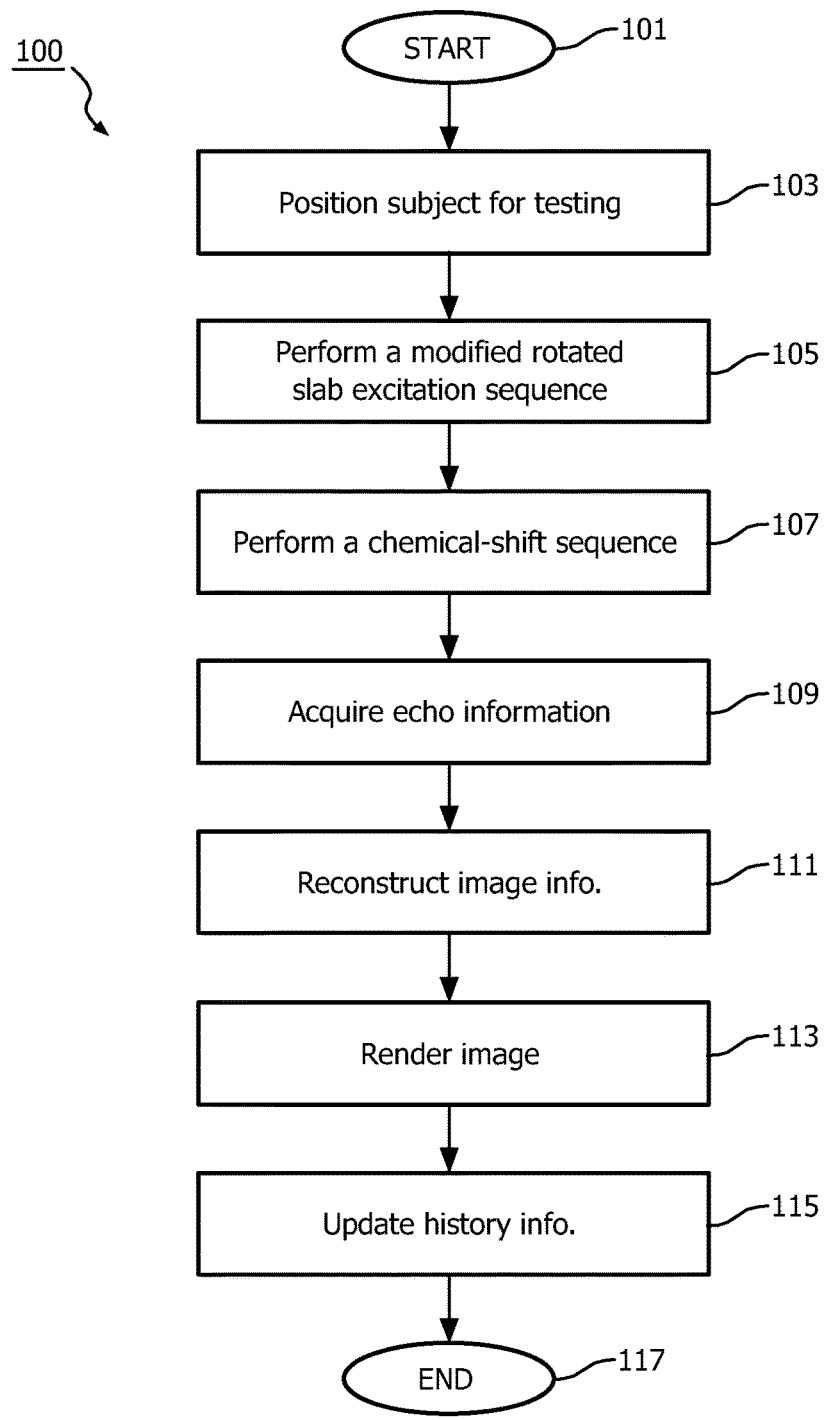
FIG. 1 is a flow diagram that illustrates a process performed by an imaging system in accordance with embodiments of the present system.

FIG. 1 is a flow diagram that illustrates a process 100 performed by an imaging system in accordance with embodiments of the present system. The process 100 may be performed using one or more computers communicating over a network and may obtain information from, and/or store information to one or more memories which may be local and/or remote from each other. The process 100 can include one or more of the following acts. Further, one or more of these acts may be combined and/or separated into sub-acts, if desired. Further, one or more of these acts may be skipped depending upon settings. The image information may include, for example, k-space image information. In operation, the process may start during act 101 and then proceed to act 103.

During act 103, the process may position a patient within a bore of an MRI system. Accordingly, the process may control actuators of a support table (e.g., a patient support table) to position the patient so that a desired portion of the subject under test (e.g., a torso of a human patient in the present embodiments) is aligned within the bore of the MR system. More particularly, the torso should be positioned within scanning volume of the MRI such that the torso may be situated within a field-of-view (FOV), as will be discussed below. The MRI system may include sensors which may provide information indicative of positions of one or more portions of the support table and/or patient relative to the bore of the MRI system. The process may obtain positioning information from a memory of the system (e.g., in accordance with a test type (e.g., torso, an abdomen, a pelvis, and/or portions thereof)) and/or from a user, if desired. After completing act 103, the process may continue to act 105.

During act 105, the process may perform a Modified Rotated Slab Excitation Sequence (mROSE) (e.g., see, R2) to suppress foldover artifacts from portions of the patient which lie outside of the FOV but are within the scanning volume such as the arms of the patient, parts of the skin, subcutaneous fat, and selected lateral parts of the internal organs which, in the present embodiments are assumed to be positioned at the sides of the torso of the patient. During the performance of the mROSE sequence, the process may generate the mROSE sequence and/or transmit the mROSE sequence to one or more coils (e.g., the gradient, RF coils, and/or other coils) of the MRI system so as to be output by the corresponding coils. The mROSE sequence may encode the volume (e.g., a three-dimensional (3D) volume) in a coronal plane while volume excitation is switched from the anterior-posterior (AP) direction to the right-left (RL) direction. In accordance with embodiments of the present system, the volume excitation may be set to the RL direction (sagittal) throughout the entire sequence. In other words, the volume excitation may include a sagittal excitation. This may provide for volume selection that may exclude undesired portions of the patent at the sides of the torso such as the patient's arms hands, etc. Further, the sagittal excitation may include RF pulses which may suppress (e.g., suppress, reduce, or entirely prevent) excitation of the undesired portions of the patient such as the arms (hands, etc.). The optimized minimum-phase RF pulses provide for a sharp transition region with minimum sideband excitation ripples, as not to excite any of the body structures (arm, subcutaneous fat, etc.). This way, substantially no undesired anatomy is excited and foldover artifacts are prevented or substantially reduced. After completing act 105, the process may continue to act 107.

During act 107, the process may perform a chemical-shift sequence to generate a large field-of-view (FOV) for acquisition of echo information from the desired portion of the patient within a desired period of time such as a breath-hold (e.g., about 15-25 seconds, however other values or ranges of values are also envisioned). The chemical-shift sequence may include a chemical-shift based gradient echo acquisition (e.g., a 3D Fast Field Echo (FFE) mDIXON) (see, R1) sequence to generate large FOV dynamic-contrast-enhanced (DCE) acquisitions (e.g., see, act 109) of the desired region (e.g., the torso, an entire abdomen, a pelvis, etc.) of the patient within a single breath-hold (e.g., about 15-25 seconds). The 3D FFE mDIXON sequence for fat/water decomposition does not prolong scan time and is substantially unaffected by B, inhomogeneity, which results in substantially uniform fat suppression throughout large FOVs such as the current FOV. Further, during performance of the chemical-shift sequence, the process may generate the chemical-shift sequence and/or transmit the sequence to one or more coils (e.g., the gradient and/or RF coils) of the MRI system. After completing act 107, the process may continue to act 109.

Referring back to acts 105 and 107, the mROSE and mDIXON methods performed by embodiments of the present system may be referred to as an mDIXON Acquisition for Torso Imaging with Selective Sagittal Excitation (mATISSE) and may provide high-resolution, homogenous fat-suppressed acquisitions (e.g., of echo information for reconstructing images) of the abdomen and pelvis of a patient with a FOV tightly adjusted (e.g., selectively controlled) to the torso and suppressing information from the arms at the side of the torso so as to be free of foldover artifacts due to the arms.

During act 109, the process may acquire echo information suitable to reconstruct, at least in part, one or more images of the patient. The echo information may be processed by the process using any suitable method or methods to generate image information for reproducing at least fat and/or water images. The echo information may be obtained within an optimum echo time for substantially uniform fat/water separation. In accordance with embodiments of the present system, the optimum echo times may be as short as possible. For example, in accordance with some embodiments, the optimum echo times may be at most approximately 2.2 ms for the first echo and 4.4 ms for the second echo, at 1.5T; and 1.2 for the first echo and 2.4 ms for the second echo at 3T, if desired. However, other echo times are also envisioned. After completing act 109, the process may continue to act 111.

During act 111, the process may reconstruct the image information in accordance with embodiments of the present system so as to obtain reconstructed image information. The reconstruction may be performed using a chemical-shift-based reconstruction method such as a commonly known mDIXON reconstruction technique. The image reconstruction may be performed using any suitable application such as multi-peak, fat-water separation based on chemical shift imaging or the like. After completing act 111, the process may continue to act 113.

During act 113, the process may render the reconstructed image information on, for example, a display of the system so that a user may view the reconstructed image. The process may further provide a user interface (UI) with which a user may interact to change viewing parameters, etc., enter information (e.g., notes, commands, etc.). The process may process inputs of the user in real time and render corresponding results in real time. After completing act 113, the process may continue to act 115.

During act 115, the process may update history information stored in a memory of the system in accordance with raw information (e.g., echo information), reconstructed image information (e.g., a fat image, a water image, etc.), results, etc., of the present process. For example, the process may store information that it uses and/or generates (e.g., results of determinations, MR image information, settings, parameters, day, date, time, etc.) in a memory of the system for later use, analysis, and/or other processing. The information may be stored in association with a name of a corresponding patient, a name of a user (e.g., a professional such as a radiologist), a FOV, a ROI, etc. Further, in some embodiments, the process may store information determined and/or calculated by the process such as various extracted image information, the transformed image information, etc., for later use. Accordingly, for example, the process may store the reconstructed image information in a memory of the system for later use. After completing act 115, the process may continue to act 117 where it ends.

Thus, embodiments of the present system may use a minimum-phase RF pulse with a modified Rotated Slab Excitation (mROSE) method. Further a combination of the mROSE method uses a minimum-phase RF pulse with a chemical-shift technique for uniform fat/water separation. Moreover, the use of very-high acceleration factors in the right-left direction may be afforded by excellent out-of FOV suppression by the minimum-phase RF pulse.

Figure 2:
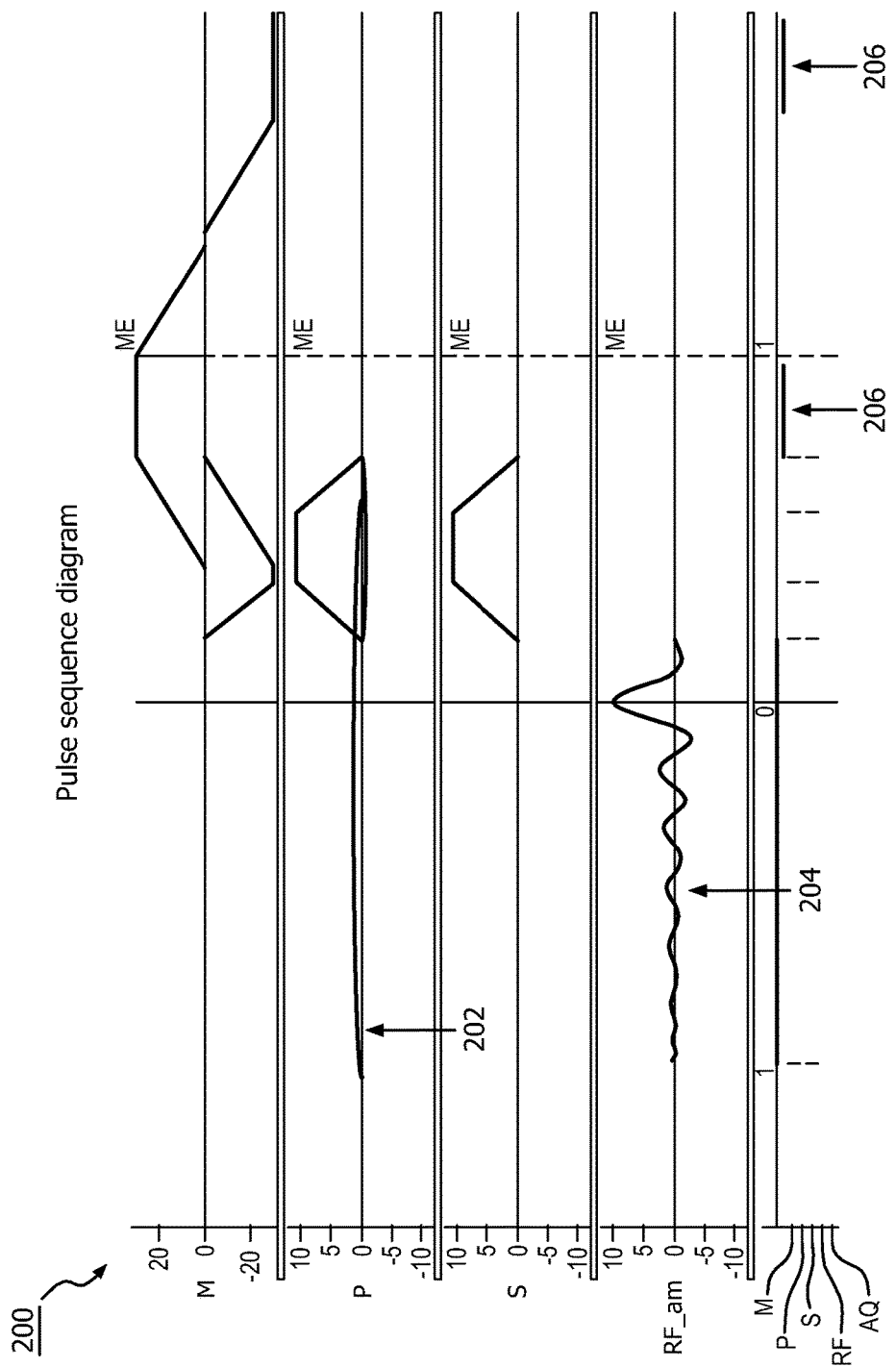
FIG. 2 shows a pulse sequence formed in accordance with embodiments of the present system.

FIG. 2 shows a pulse sequence diagram 200 formed in accordance with embodiments of the present system. The sequence may include one or more of an excitation along the sagittal plane (e.g., same plane as the phase-encoding plane) 202, a standard or a minimum-phase RF pulse 204, and an acquisition of two echoes 206 at optimal echo times as required for mDIXON reconstruction.

Experimental Results:

Experimental results will now be described with reference to FIGS. 3A through 4C. The experimental results were obtained using a 1.5T wide-bore (70 cm) Ingenia scanner (by Philips™ Medical™). Embodiments of the present system provide enhanced speed and fat-suppression ability of chemical-shift based gradient echo acquisition (3D FFE mDIXON) to generate large-FOV, DCE acquisitions of the entire abdomen and pelvis of a patient within a single breath-hold. Phantom results are shown in FIGS. 3A through 3D, and images of a patient are shown in FIGS. 4A through 4C. Further, no radio-frequency (RF) blankets were used in the acquisition of the images of FIGS. 3A through 4C.

FIG. 3A shows an image 300A acquired using a phantom and application of a small FOV. Frame 302A surrounds the small field-of-view (FOV) centered on Frame 304A. FIG. 3B shows an image 300B of a portion of the phantom acquired using symmetric long RF pulses which result in excellent out-of-volume signal suppression but with incomplete fat/water separation due to the long echo times required by the long symmetric RF pulse. Frame 306B surrounds an ROI that was used for evaluation of the level of fold-over artifact suppression FIG. 3C shows an image 300C of a portion of the phantom acquired using shorter RF pulses than the symmetric RF pulses used on FIG. 3B. This improves the mDIXON reconstruction but causes poor out-of FOV suppression when using the ROSE method. FIG. 3D shows an image 300D of a portion of the phantom acquired in accordance with embodiments of the present system. The image 300D was acquired using stretched minimum-phase RF pulses in accordance with embodiments of the present system. These stretched minimum phase RF pulses generate both excellent ROSE artifact suppression and mDIXON fat suppression.

FIG. 4A shows an image 400A of a patient and the position of a small coronal FOV 402A that excludes the arms 401A. The small coronal FOV 402A allows shorter acquisition times but leaves arms 401A of the patient outside of the FOV. FIG. 4B shows an image 400B of the patient acquired using a small FOV. Artifacts 403A (e.g., foldover artifacts) are generated by the arms 401A when right-left (RL) phase encoding is applied with the small FOV. FIG. 4C shows an image 400C of the patient acquired in accordance with embodiments of the present system. The image was obtained using a combined sagittal three-dimensional (3D) excitation based upon a stretched minimum-phase RF pulses and coronal mDIXON readout which provides for a small FOV with excellent outer-volume signal elimination and proper fat suppression.

Accordingly, embodiments of the present system provide MR imaging methods for acquiring images with high spatial resolution within breath-hold acquisition times and with uniform fat/water separation. The images may be acquired with patients comfortably positioned with their arms beside their bodies or with their arms in a downward position. Further benefits of the present system include the avoidance of scan-session interruption, which interruption is typically due to the need to pull a patient from a scanner bore to rest a patient's upward positioned hands. Further benefits of the present system include a reduced set up time when compared with typical methods which position a patient's hands in a downward position as radio-frequency (RF) shielding does not have to be placed about the patient's arms to suppress undesirable signals.

Figure 5:
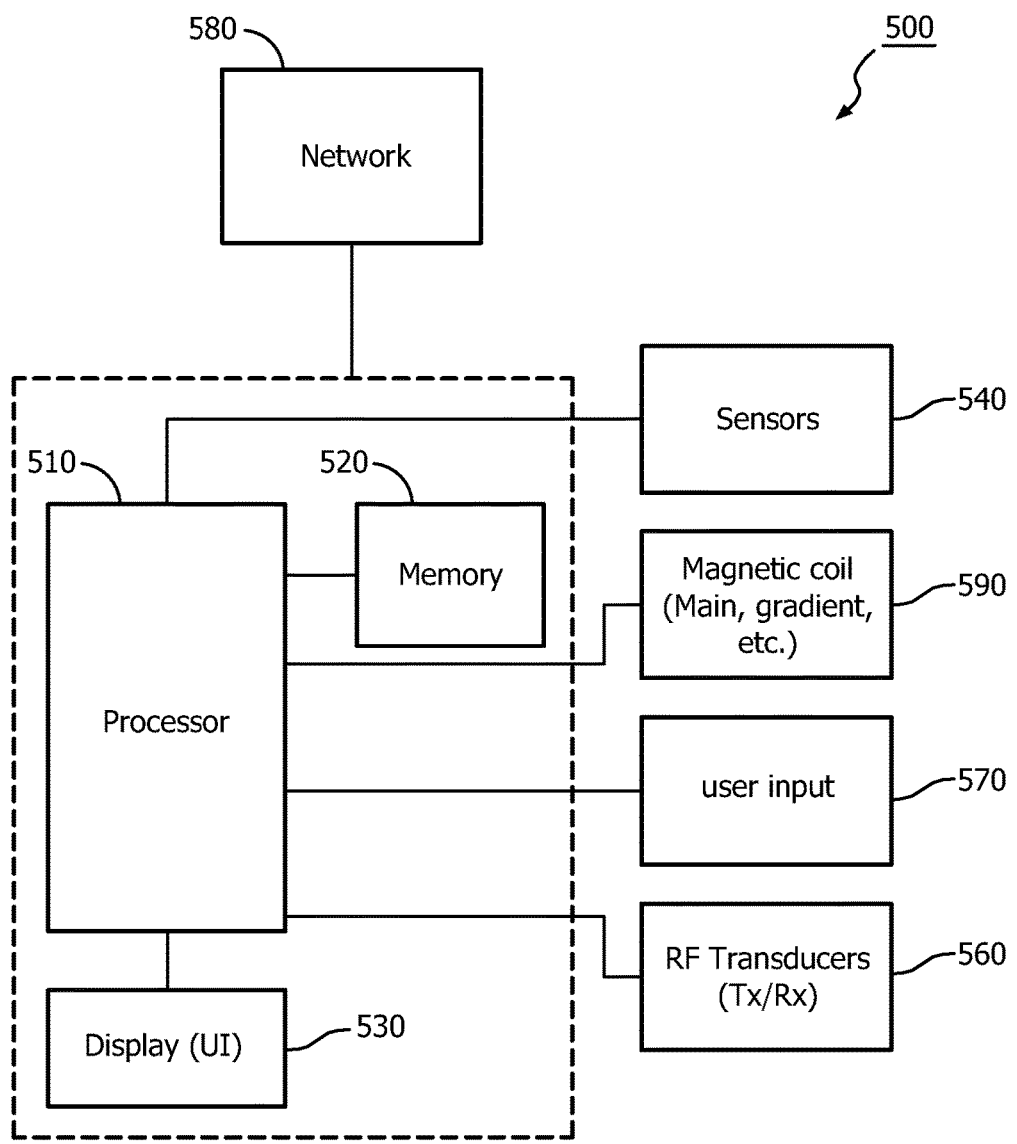
FIG. 5 shows a portion of a system (e.g., peer, server, etc.) in accordance with an embodiment of the present system.

FIG. 5 shows a portion of a system 500 (e.g., peer, server, etc.) in accordance with embodiments of the present system. For example, a portion of the present system may include a processor 510 (e.g., a controller) operationally coupled to a memory 520, a display 530, sensors 540, RF transducers 560, magnetic coils 590, and a user input device 570. The memory 520 may be any type of device for storing application data as well as other data related to the described operation. The application data and other data are received by the processor 510 for configuring (e.g., programming) the processor 510 to perform operation acts in accordance with the present system. The processor 510 so configured becomes a special purpose machine particularly suited for performing in accordance with embodiments of the present system.

The operation acts may include configuring an MRI system by, for example, controlling optional support actuators, the magnetic coils 590, and/or the RF transducers 560. The support actuators may control a physical location (e.g., in x, y, and z axes) of a patient, if desired. The magnetic coils 590 may include main magnetic coils, and gradient coils (e.g., x-, y-, and z-gradient coils) and may be controlled to emit a main magnetic field and/or gradient fields in a desired direction and/or strength. The controller may control one or more power supplies to provide power to the magnetic coils 590 so that a desired magnetic field is emitted at a desired time. The RF transducers 560 may be controlled to transmit RF pulses at the patient and/or to receive echo information therefrom. A reconstructor may process received signals such as the echo information and transform them (e.g., using one or more reconstruction techniques of embodiments of the present system) into content which may include image information (e.g., still or video images (e.g., video information)), data, and/or graphs that can be rendered on, for example, a user interface (UI) of the present system such as on the display 530, a speaker, etc. Further, the content may then be stored in a memory of the system such as the memory 520 for later use. Thus, operation acts may include requesting, providing, and/or rendering of content such as, for example, reconstructed image information obtained from the echo information. The processor 510 may render the content such as video information on a UI of the system such as a display of the system.

The user input 570 may include a keyboard, a mouse, a trackball, or other device, such as a touch-sensitive display, which may be stand alone or be a part of a system, such as part of a personal computer, a personal digital assistant (PDA), a mobile phone (e.g., a smart phone), a monitor, a smart- or dumb-terminal or other device for communicating with the processor 510 via any operable link. The user input device 570 may be operable for interacting with the processor 510 including enabling interaction within a UI as described herein. Clearly the processor 510, the memory 520, display 530, and/or user input device 570 may all or partly be a portion of a computer system or other device such as a client and/or server.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 520 or other memory coupled to the processor 510.

The program and/or program portions contained in the memory 520 may configure the processor 510 to implement the methods, operational acts, and functions disclosed herein. The memories may be distributed, for example between the clients and/or servers, or local, and the processor 510, where additional processors may be provided, may also be distributed or may be singular. The memories may be implemented as electrical, magnetic or optical memory, or any combination of these or other types of storage devices. Moreover, the term "memory" should be construed broadly enough to encompass any information able to be read from or written to an address in an addressable space accessible by the processor 510. With this definition, information accessible through a network is still within the memory, for instance, because the processor 510 may retrieve the information from the network for operation in accordance with the present system.

The processor 510 is operable for providing control signals and/or performing operations in response to input signals from the user input device 570 as well as in response to other devices of a network and executing instructions stored in the memory 520. The processor 510 may include one or more of a microprocessor, an application-specific or general-use integrated circuit(s), a logic device, etc. Further, the processor 510 may be a dedicated processor for performing in accordance with the present system or may be a general-purpose processor wherein only one of many functions operates for performing in accordance with the present system. The processor 510 may operate utilizing a program portion, multiple program segments, or may be a hardware device utilizing a dedicated or multi-purpose integrated circuit.

Embodiments of the present system may provide fast imaging methods to acquire and reconstruct images. Suitable applications may include imaging systems such as magnetic resonance imaging (MRI) systems and the like which require: a short acquisition time and high resolution while providing homogeneous fat suppression and out-of-FOV signal suppression. Accordingly, embodiments of the present system provide for a high-resolution, breath-held DCE acquisition clinical MRE protocol which can be used upon patients who are comfortably positioned with their arms along their side while achieving homogeneous fat suppression and out-of-FOV signal suppression.

Further variations of the present system would readily occur to a person of ordinary skill in the art and are encompassed by the following claims.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. In addition, the section headings included herein are intended to facilitate a review but are not intended to limit the scope of the present system. Accordingly, the specification and drawings are to be regarded in an illustrative manner and are not intended to limit the scope of the appended claims.

In interpreting the appended claims, it should be understood that:
a) the word "comprising" does not exclude the presence of other elements or acts than those listed in a given claim;
b) the word "a" or "an" preceding an element does not exclude the presence of a plurality of such elements;
c) any reference signs in the claims do not limit their scope;
d) several "means" may be represented by the same item or hardware or software implemented structure or function;
e) any of the disclosed elements may be comprised of hardware portions (e.g., including discrete and integrated electronic circuitry), software portions (e.g., computer programming), and any combination thereof;
f) hardware portions may be comprised of one or both of analog and digital portions;
g) any of the disclosed devices or portions thereof may be combined together or separated into further portions unless specifically stated otherwise;
h) no specific sequence of acts or steps is intended to be required unless specifically indicated; and
i) the term "plurality of" an element includes two or more of the claimed element, and does not imply any particular range of number of elements; that is, a plurality of elements may be as few as two elements, and may include an immeasurable number of elements.

REFERENCES

References 1-2 listed below are incorporated herein by reference and are referred to using reference numerals R1 and R2, respectively, throughout the specification. For example, R1 may make reference to the first reference (e.g., by Ma, J).

1. Ma, J., *MRM* 52(2):415-9, 2004.
2. Brau, A. et al., Proc. *ISMRA* 116, 502, 2008.

The invention claimed is:

1. A magnetic resonance imaging (MRI) system, the system comprising at least one controller which is configured to:
perform a rotated slab excitation sequence for volume selection to exclude portions of a subject under exam which are within a scanning volume and outside of a field-of-view (FOV) so as to reduce foldover artifacts which originate from the excluded portions of the subject under exam, wherein the rotated slab excitation sequence performs volume excitation in a sagittal plane using radio-frequency (RF) pulses having transition regions configured to reduce excitation of the excluded portions of the subject, and encodes the scanning volume in a coronal plane;

after performing the rotated slab excitation sequence for the volume selection, perform a chemical-shift sequence comprising a modified DIXON (mDIXON) sequence for fat/water separation within the FOV which lies within the scanning volume; and after performing the chemical-shift sequence for the fat/water separation, acquire echo information of an object within the FOV for reconstructing an image of the object;

wherein the rotated slab excitation and mDIXON sequences and the image acquisition are performed within a time interval of between 15 and 25 seconds.

2. The MRI system of claim 1, wherein the at least one controller acquires the echo information while arms of the subject under exam are within the scanning volume and positioned at the sides of a torso of the subject under exam.

3. The MRI system of claim 2, further comprising a support movably controlled by the at least one controller and which is configured to position the subject under exam into scanning position relative to the scanning volume.

4. The MRI system of claim 1, wherein the controller acquires the echo information within an optimum echo time (TE) for uniform fat/water separation.

5. A method of reconstructing images obtained by an MR imaging (MRI) system the method performed by at least one controller of the MR imaging system and comprising:

performing a rotated slab excitation sequence for volume selection to exclude portions of a subject under exam which are within a scanning volume and outside of a field-of-view (FOV) so as to reduce foldover artifacts which originate from the excluded portions of a subject under exam, wherein the rotated slab excitation sequence performs volume excitation in a sagittal plane using minimum-phase radio-frequency (RF) pulses that encode the scanning volume in a coronal plane;

after the act of performing the rotated slab excitation sequence for the volume selection, performing a chemical-shift sequence comprising a modified DIXON (mDIXON) sequence for fat/water separation within the FOV which lies within the scanning volume;

after the act of performing the chemical-shift sequence for the fat/water separation, acquiring echo information for reconstructing at least a part of an image; and wherein the rotated slab excitation and mDIXON sequences and the image acquisition are performed within a time interval between 15 and 25 seconds.

6. The method of claim 5, wherein the echo information is acquired while arms of the subject under exam are within the scanning volume and positioned at the sides of a torso of the subject under exam.

7. The method of claim 5, further comprising an act of controlling, by the at least one controller, a support to position the subject under exam to scanning position within the scanning volume.

8. The method of claim 5, wherein the controller acquires the echo information within an optimum echo time (TE) for fat/water separation.

9. A non-transitory computer readable medium comprising computer instructions which, when executed by a processor, configure the processor to reconstruct images obtained from a magnetic resonance (MR) image system by performing the acts of:

performing a rotated slab excitation sequence for volume selection to exclude portions of a subject under exam which are within a scanning volume and outside of a field-of-view (FOV) so as to reduce foldover artifacts which originate from the excluded portions of the subject under exam, wherein the rotated slab excitation sequence performs volume excitation in a sagittal plane using radio-frequency (RF) pulses to encode the scanning volume in a coronal plane;

after the act of performing the rotated slab excitation sequence for the volume selection, performing a chemical-shift sequence comprising a modified DIXON (mDIXON) sequence for fat/water separation within the FOV which lies within the scanning volume;

after the act of performing the chemical-shift sequence for the fat/water separation, acquiring echo information for reconstructing at least a part of an image; and wherein the computer instructions further configure the processor to perform the mDIXON and rotated slab excitation sequence and the image acquisition substantially within a time interval of between 15 and 25 seconds.

10. The non-transitory computer readable medium of claim 9, wherein the computer instructions further configure the processor to acquire the echo information while arms of the subject under exam are within the scanning volume and positioned at the sides of a torso of the subject under exam.

11. The non-transitory computer readable medium of claim 10, wherein the computer instructions further configure the processor to control a support to position the subject under exam to scanning position within the scanning volume.

12. The non-transitory computer readable medium of claim 9, wherein the computer instructions further configure the processor to acquire the echo information within an optimum echo time (TE) for substantially uniform fat/water separation.

13. The MRI system of claim 1, wherein the radio frequency pulses are minimum-phase RF pulses.

14. The method of claim 5, wherein the minimum-phase radio frequency pulses have transition regions to reduce excitation of the excluded portions of the subject.

15. The method of claim 5, wherein the minimum-phase radio frequency pulses include a plurality of oscillations building in time to an RF peak.

16. The method of claim 5, wherein the minimum-phase radio frequency pulses include an RF amplitude peak preceded by a plurality of RF amplitude oscillations.

17. The method of claim 16, wherein the preceding RF amplitude oscillations grow progressively larger with time toward the RF amplitude peak, the preceding RF amplitude oscillations being lower in magnitude than the RF amplitude peak.

18. The non-transitory computer-readable medium of claim 9, wherein the RF pulses have transition regions for reducing excitation of the excluded portions of the subject.

19. The non-transitory computer-readable medium of claim 9, wherein the RF pulses are minimum-phase RF pulses.

* * * * *